(12) United States Patent  (10) Patent No.: US 9,204,558 B2
Chang  (45) Date of Patent: Dec. 1, 2015

(54) METHOD FOR MANUFACTURING PACKAGED LIGHT EMITTING DIODE

(76) Inventor: Kuo-Kuang Chang, Taichung (TW)

( * ) Notice: Subject to any disclaimer, the term of this patent is extended or adjusted under 35 U.S.C. 154(b) by 242 days.

(21) Appl. No.: 13/824,894

(22) PCT Filed: Sep. 21, 2010

(86) PCT No.: PCT/CN2010/077171
§ 371 (c)(1),
(2), (4) Date: Mar. 18, 2013

(87) PCT Pub. No.: WO2012/037720
PCT Pub. Date: Mar. 29, 2012

(65) Prior Publication Data
US 2013/0192064 A1  Aug. 1, 2013

(51) Int. Cl.
*H05K 3/30*  (2006.01)
*F21K 99/00*  (2010.01)
*F21Y 101/02*  (2006.01)
*F21V 29/15*  (2015.01)

(52) U.S. Cl.
CPC .. *H05K 3/30* (2013.01); *F21K 9/56* (2013.01); *F21K 9/90* (2013.01); *F21V 29/15* (2015.01); *F21Y 2101/02* (2013.01); *H01L 2224/48091* (2013.01); *H01L 2224/48137* (2013.01); *Y10T 29/4913* (2015.01)

(58) Field of Classification Search
CPC ......... Y10T 29/4913; F21K 9/56; F21K 9/90; F21Y 2101/02; H01L 2224/48091; H01L 2224/48137; H01L 2924/00014

USPC ............... 29/832, 840; 313/237, 498
See application file for complete search history.

(56) References Cited

U.S. PATENT DOCUMENTS

| 7,301,175 | B2* | 11/2007 | Izuno et al. | 257/98 |
| 7,528,422 | B2  | 5/2009  | Murphy | |
| 7,723,740 | B2* | 5/2010  | Takashima et al. | 257/98 |
| 2004/0061433 | A1* | 4/2004 | Izuno et al. | 313/498 |
| 2005/0072981 | A1* | 4/2005 | Suenaga | 257/88 |
| 2005/0156496 | A1* | 7/2005 | Takashima et al. | 313/237 |
| 2007/0205425 | A1* | 9/2007 | Harada | 257/98 |

FOREIGN PATENT DOCUMENTS

| CN | 100341164 C | 10/2007 |
| CN | 100388513 C | 5/2008 |
| CN | 101643315 A | 2/2010 |
| CN | 101371358 B | 6/2010 |
| CN | 201514954 U | 6/2010 |
| JP | 2006-156448 A | 6/2006 |

* cited by examiner

*Primary Examiner* — Carl Arbes
(74) *Attorney, Agent, or Firm* — Muncy, Geissler, Olds & Lowe, P.C.

(57) ABSTRACT

A method for manufacturing packaged LED is provided in the present invention. A vacuum closed space is enclosed by a base plate and a cover plate, and LED chip on the base plate is disposed in the closed space. The cover plate includes a fluorescent layer, and space between the fluorescent layer and the LED chip is vacuum. Thus, heat generated by the LED chip may not affect fluorescent material inside the fluorescent layer so that the package of LED becomes more durable.

4 Claims, 3 Drawing Sheets

METHOD FOR MANUFACTURING PACKAGED LIGHT EMITTING DIODE

BACKGROUND OF THE INVENTION

1. Field of the Invention

The present invention relates to a packaged LED, more specifically to a method for manufacturing package of LED.

2. Description of the Prior Art

A conventional package of LED is made by blending fluorescent powder in silica gel or epoxy resin, and the LED chip is coated with silica gel or epoxy resin. Light emitted by the LED is able to excite the fluorescent powder so that visible light in various colors is further emitted.

However, the conventional package of LED is not stable enough and is not durable. Specifically, the silica gel or the epoxy resin may be eroded by water so that the fluorescent powder may contact water to result degeneration. Thus, the package of LED is not durable. Besides, the LED chip may generate heat when being used, so the silica gel, the epoxy resin, or the fluorescent powder around the LED chip may degenerate. Thus, the durability of the package of LED is decreased.

SUMMARY OF THE INVENTION

The main object of the present invention is to provide a package of LED which is more stable and durable.

To achieve the above and other objects, a method for manufacturing package of LED of the present invention includes steps of material preparation, circuit setting up, and fixation.

In the step of material preparation, a base plate and a cover plate are prepared. The base plate has a first face and a second face, and the cover plate has a third face and a fourth face. A protruded flange is formed on one of the second face of the base plate and the third face of the cover plate. A recess is enclosed by the flange. The cover plate further includes a fluorescent layer.

In the step of circuit setting up, the second face of the base plate is disposed with at least one LED circuit wherein the LED circuit includes at least one LED chip.

In the step of fixation, the cover plate is fixed onto the base plate in vacuum so that the recess is closed by the cover plate to form a closed space. The LED circuit is located in the closed space.

Thereby, heat generated by the LED circuit is transmitted less to the fluorescent layer because of the vacuum space between the LED circuit and the fluorescent layer so that degeneration of the fluorescent layer is prevented. Also, the cover plate is made of glass to prevent the fluorescent layer from being contacted. Thus, the package of LED becomes more durable.

The present invention will become more obvious from the following description when taken in connection with the accompanying drawings, which show, for purpose of illustrations only, the preferred embodiment(s) in accordance with the present invention.

DETAILED DESCRIPTION OF THE PREFERRED EMBODIMENTS

Figure 1:
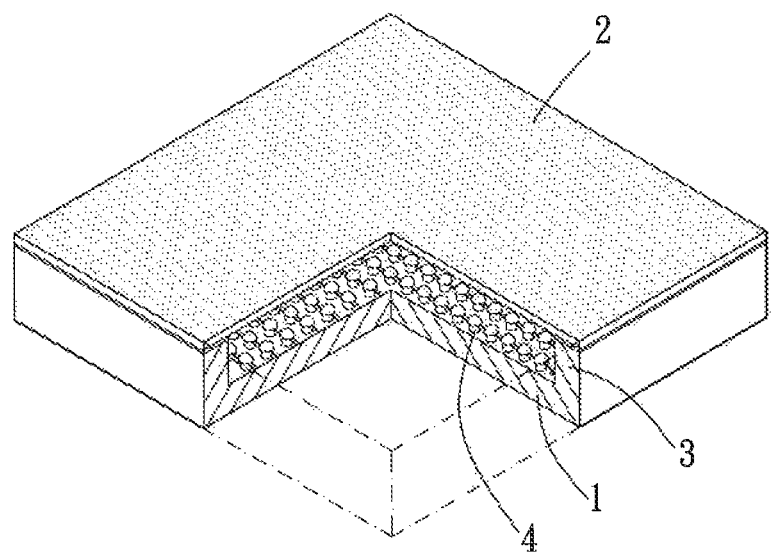
FIG. 1 is a partial cross-section drawing of the present invention.
Figure 2:
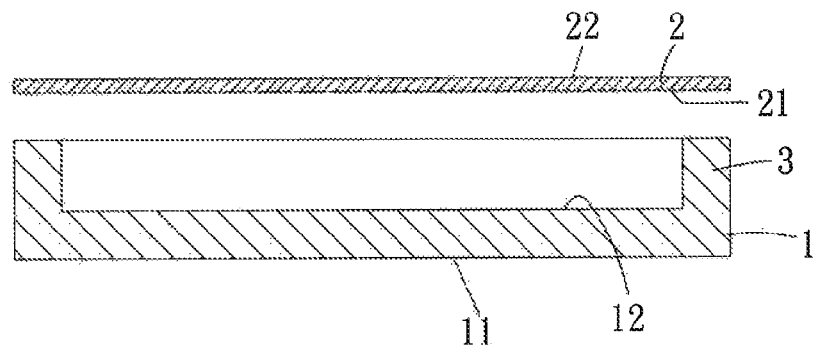
FIGS. 2 to 5 are illustrations showing processes of the present invention.
Figure 3:
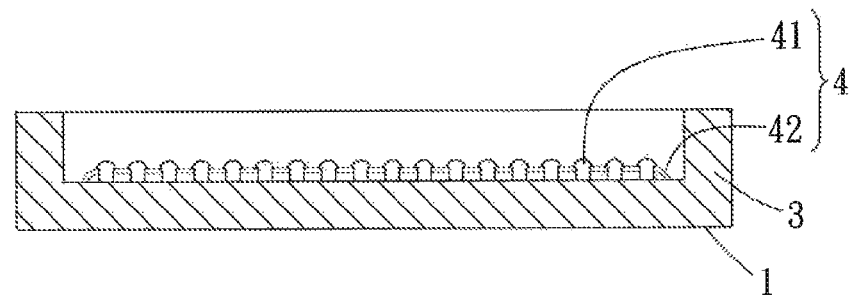
Figure 4:
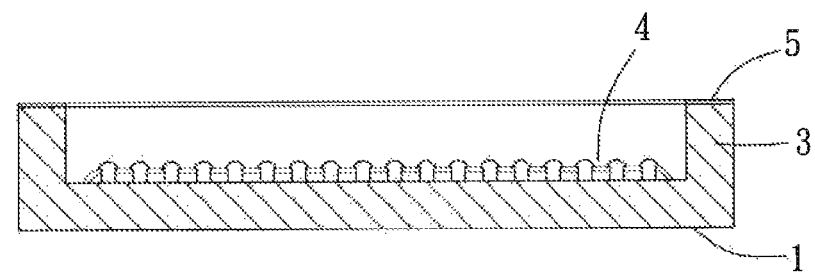
Figure 5:
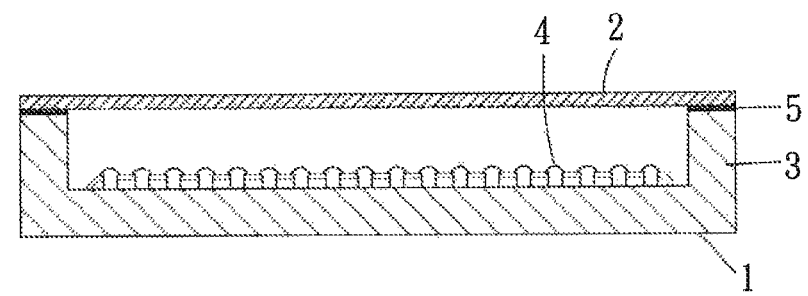

The present invention provides a method for manufacturing package of LED such as the one shown in FIG. 1.

Please refer to FIGS. 2 to 5, the method for manufacturing package of LED includes steps listed below.

The first step is material preparation. A base plate 1 and a cover plate 2 are prepared. Specifically, the base plate 1 made of copper alloy or ceramics has a first face 11 and a second face 12. The cover plate 2 has a third face 21 and a fourth face 22. A protruded flange 3 is formed on the second face 12 of the base plate 1, and a recess is enclosed by the flange 3. Specifically, the flange 3 can be integrally formed on the base plate 1 or be a single element fixed on the base plate 1 by adhesive. In other possible embodiments, the flange 3 can be disposed or formed on the third face 21. The cover plate 2 includes a fluorescent layer. More specifically, fluorescent material is distributed inside the cover plate. In practice, the cover plate 2 is made of glass, acrylic, or other transparent material and is blended with fluorescent powders when manufacturing. Thus, the cover plate 2 is the fluorescent layer. Preferably, the cover plate 2 is formed with bumpy patterns on the third face 21 or the fourth face 22 so that reflection or refraction is increased to facilitate focusing.

The second step is circuit setting-up. An LED circuit 4 is fixedly disposed on the second face 12 of the base plate 1. The LED circuit 4 includes one or more LED chips 41 and further cables 42 connecting the LED chips 41 together. Preferably, SMT (Surface Mount Technology) is introduced for the LED circuit 4 arrangement.

The last step is fixation. The cover plate 2 is fixed disposed onto the base plate 1 so that the recess is closed by the cover plate 2 and the base plate 1 to form a closed space. Specifically, the closed space is vacuum, and the LED circuit 4 is located in the closed space. Besides, the cover plate 2 and the base plate 1 are fixed together by a photopolymer 5 therebetween. In other possible embodiments of the present invention, the cover plate 2 can be made of acrylic or other material which is easy to melt, and the cover plate 2 is heated by high frequency heating device to fix the cover plate 2 and the base plate 1 together.

By the previous steps, the package of LED shown in FIG. 1 can be manufactured. Specifically, the LED chip 41 is separated from the cover plate 2, and the closed space is vacuum so that heat generated by the LED chip 41 is more difficult to be transmitted to the cover plate 2. Thus, fluorescent material in the cover plate 2 is prevented from degeneration by heat. In addition, the fluorescent material in the cover plate 2 is embedded in other material of the cover plate 2, so the fluorescent material is prevented from exposing outside so that the fluorescent material is prevented from degeneration by water.

Besides, the closed space between the cover plate 2 and the base plate 1 is vacuum so that light emitted by the LED chip 41 is prevented from contacting air to result decaying. Thus, illuminant efficiency is promoted. On the other hand, the cover plate 2 is optionally formed with bumpy patterns for focusing better.

Figure 6:
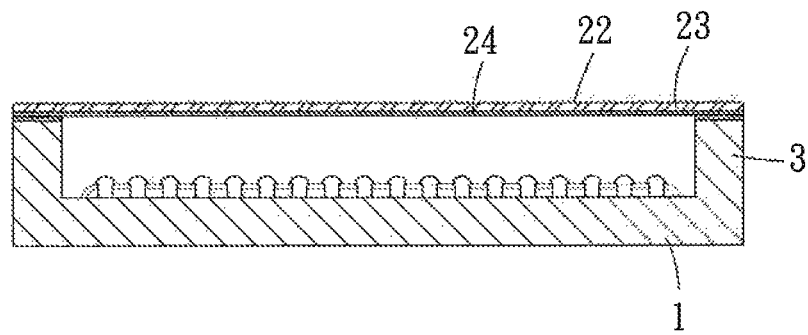
FIG. 6 is a cross-section drawing showing a second embodiment of the present invention.
Figure 7:
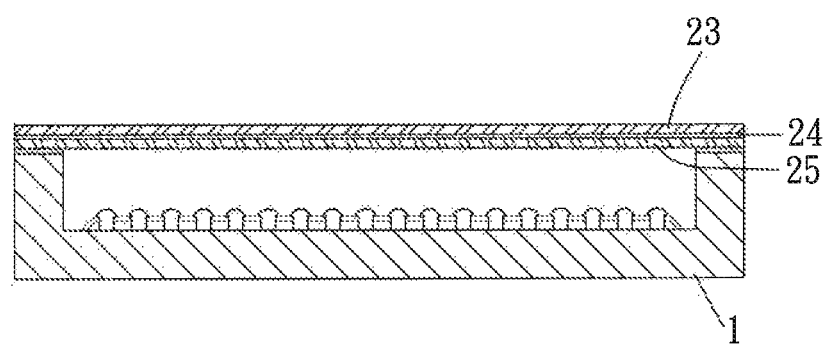
FIG. 7 is a cross-section drawing showing a third embodiment of the present invention.

Please refer to FIG. 6 for a second embodiment of the present invention, the cover 2 further includes a protection layer 23 disposed on the fourth face 23 of the cover plate 2. The protection layer 23 is adapted for blocking air or water outside from the fluorescent material on surface of the fluorescent layer 24. Please refer to FIG. 7, the cover plate 2 can further include another protection layer 25 wherein the fluorescent layer 24 is sandwiched by the two protection layers 23, 25. Thus, stability of the fluorescent layer 24 is further promoted.

What is claimed is:

1. A method for manufacturing packaged LED, including steps of:
    material preparation: preparing a base plate and a cover plate, the base plate having a first face and a second face, the cover plate having a third face and a fourth face, a flange being formed on one of the second face of the base plate and the third face of the cover plate, a recess being enclosed by the flange, the cover plate including a fluorescent layer;
    circuit setting up: setting up at least one LED circuit on the second face of the base plate, the LED circuit including at least one LED chip;
    fixation: fixing the cover plate onto the base plate in vacuum so that the recess is closed to form a closed space, the LED circuit being located in the closed space;
    wherein the cover plate includes two protection layers, the fluorescent layer is sandwiched between the two protection layers and a surrounding lateral side of the fluorescent layer is non-sealed, and one of the protection layers is attached to the base plate.

2. The method for manufacturing packaged LED of claim 1, wherein in the step of fixation, the cover plate is fixed to the base plate by a photopolymer therebetween.

3. The method for manufacturing packaged LED of claim 1, wherein the third face of the cover plate is formed with prismatic bumpy patterns.

4. The method for manufacturing packaged LED of claim 1, wherein the fourth face of the cover plate is formed with prismatic bumpy patterns.

* * * * *